(12) United States Patent
Miyaji

(10) Patent No.: US 6,228,464 B1
(45) Date of Patent: May 8, 2001

(54) PRINTED PATTERN DEFECT REPAIR SHEET, AND REPAIR DEVICE AND METHOD FOR PRINTED PATTERN DEFECT

(75) Inventor: Minoru Miyaji, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/058,186

(22) Filed: Apr. 10, 1998

(30) Foreign Application Priority Data

Apr. 28, 1997 (JP) .................................................. 9-111178

(51) Int. Cl.[7] ..................................................... B32B 27/14

(52) U.S. Cl. ........................... 428/195; 428/46; 428/41.8; 428/41.7

(58) Field of Search .................................. 250/483, 486, 250/365, 458, 368, 548; 356/399, 400, 401; 428/40.1, 41.7, 41.8, 84, 79, 46

(56) References Cited

U.S. PATENT DOCUMENTS

| | | | |
|---|---|---|---|
| 3,801,817 | * | 4/1974 | Goodman ............................... 250/365 |
| 3,890,507 | * | 6/1975 | Goodman ............................... 250/483 |
| 4,636,587 | * | 1/1987 | Moriwaki et al. ...................... 178/18 |
| 5,241,187 | * | 8/1993 | Ikeda et al. ........................... 250/548 |

* cited by examiner

Primary Examiner—Merrick Dixon

(57) ABSTRACT

Defects of printed patterns occurring during screen printing are repaired with high efficiency by employing a defect repair sheet in which a material layer for repair is formed on a transparent sheet and an adhesive layer is formed on the transparent sheet in order to cover the material layer for repair. The defect repair sheet is pressed on a defective portion of a predetermined pattern formed on a base by printing, thereby transferring the material layer for repair to the defective portion. The transferred portion is then subjected to, for example, a laser irradiation, so that the adhesive layer transferred together with the material layer for repair is vaporized and the material layer for repair is fired or heated and hence evaporated.

13 Claims, 7 Drawing Sheets

PRINTED PATTERN DEFECT REPAIR SHEET, AND REPAIR DEVICE AND METHOD FOR PRINTED PATTERN DEFECT

BACKGROUND OF THE INVENTION

1. Field of the Invention

The present invention relates to a repair of a pattern defect of a base that is obtained by a technique of screen printing, e.g., plasma display panels. More particularly, the invention relates to a repair of a pattern defect of a printed material layer, which is performed after forming a variety of material layers, such as a dielectric layer and an electrode layer, on a substrate by a technique of screen printing.

2. Description of the Background Art

Screen printing (which is also called thick film printing) is a printing method in which a screen plate is placed in close proximity to a base and a pasty printing material is transferred from a screen mesh of a desired pattern to the base. This printing method is employed in forming a pattern of an electrode wire layer, a dielectric layer, a barrier rib portion, a phosphor layer or the like, on a substrate constituting a plasma display panel (PDP). Alternatively, this method is employed in forming a phosphor layer of a CRT (cathode ray tube), an electrode layer, a dielectric layer or the like of a printer head substrate.

In screen printing, after a printing material paste is transferred onto a substrate, a firing or heating process is performed under conditions suitable for the printing material paste to evaporate unneeded ingredients in the paste, thereby forming an electrode wire layer, a dielectric layer and the like on the substrate.

Such a screen printing is favorable for reducing manufacturing cost because of its low device cost and running cost. However, its pattern transfer accuracy is not so high and it is susceptible to a pattern defect. Various improvements have been achieved to improve the transfer accuracy. However, for example, when a pattern of an electrode wire of a PDP is formed on a substrate (i.e., a base 35) by printing as shown in FIG. 7, defects might occur at several points in the overall electrode wire of the substrate. For the panel of a display device, such as a PDP, a printed pattern defect directly deteriorates the display quality of the display device. Therefore, if a printed defect occurs, it is necessary to repair the defect.

In conventional repair of printed pattern defects, a pattern defect is found by observation with a microscope or a naked eye, and then the repair material paste 37 having the same composition as the printing material of a material layer is printed to a defect position by using a repair screen 36 as a screen plate for repair, as shown in FIG. 8. A repair pattern 38 having a width identical to the pattern width of a material layer repaired, as shown in FIG. 9, has been formed in the repair screen 36. A repair printing is performed by squeezing the repair material paste 37 from the repair pattern 38 to a defective portion by using a squeegee 39. Thereafter, in order to fire the repair material paste 37 of the defective portion, the substrate is put into a firing furnace as shown in FIG. 10, having a construction similar to that in firing printed patterns, and then subjected to a re-firing for the entire surface of the substrate.

The conventional pattern defect repairs by means of printing, however, have difficulties in alignment between the repair screen 36 and a pattern defect. Specifically, a screen printing causes a mismatch of patterns between a screen pattern and a pattern of paste that has actually been printed on a base. Therefore, such a mismatch must be taken into consideration when making an alignment between a screen plate and a pattern defect. Also, a pattern to be printed may actually vary with the kind of screen pattern and printing paste used and situations where a printing is performed. Thus, the pattern defect repair by printing requires much time to adjust an alignment, resulting in a poor working efficiency.

In addition, since a repair screen 36 on which a material paste for repair has been put is placed on a substrate, the surface of the substrate might become dirty.

Moreover, due to the characteristics of screen printing, it is difficult to transfer a material paste for repair into a local defective portion so as to have a uniform thickness, and a variation is liable to occur. Further, a repaired portion tends to upheave, which might adversely affect the smoothness and the like of other material layers that are formed thereon after repair.

SUMMARY OF THE INVENTION

According to a first aspect of the present invention, a defect repair sheet of a printed pattern used in repairing a pattern defect of a material layer that is printed on a base by employing a screen plate includes a transparent sheet; a material layer for repair formed on the transparent sheet; and an adhesive layer formed on the transparent sheet so as to cover the material layer for repair, having an adhesive property to the base which makes it possible to transfer the material layer for repair to the base.

According to a second aspect, the defect repair sheet of the first aspect is characterized in that the material layer for repair is formed on the transparent sheet so as to have a predetermined pattern.

According to a third aspect, the defect repair sheet of the first aspect is characterized in that the adhesive layer includes a layer composed of a material that evaporates during a firing processing, which is performed after transferring the material layer for repair and the adhesive layer to a defective portion of the base.

According to a fourth aspect, the defect repair sheet of the third aspect is characterized in that the material layer for repair includes a layer composed of an electrode material.

According to a fifth aspect, a defect repair device for repairing a pattern defect of a material layer that is printed on a base by using a screen plate employs a defect repair sheet in which a material layer for repair having a predetermined pattern is formed on a transparent sheet, and includes an alignment means for aligning a pattern of the material layer for repair of the defect repair sheet and a pattern defective portion of the material layer of the base; and a transfer means for transferring the material layer for repair to the defective portion by pressing the defect repair sheet on the base from a side on which the material layer for repair is not formed, along a formed pattern of the material layer for repair.

According to a sixth aspect, the defect repair device of the fifth aspect is characterized in that the defect repair sheet further includes an adhesive layer formed on the transparent sheet so as to cover the material layer for repair, having an adhesive property to the base which makes it possible to transfer the material layer for repair to the base.

According to a seventh aspect, the defect repair device of the sixth aspect is characterized in that the adhesive layer includes a layer composed of a material that evaporates during a firing processing, which is performed after transferring the material layer for repair and the adhesive layer to a defective portion of the base.

According to an eighth aspect, the defect repair device of the fifth aspect is characterized in that the alignment means includes an image taking means that takes an image of the base to obtain an image data of a pattern of the material layer; image processing means that detects a contour of a pattern of the material layer based on the image data and detects whether the pattern has a defect to output a result of image processing; and a position adjusting means that, when a defect is present in the pattern of the material layer, adjusts a position of the base so that the defective portion has a certain positional relation with respect to the material layer for repair of the defect repair sheet previously positioned in a predetermined position.

According to a ninth aspect, the defect repair device of the eight aspect is characterized in that the image taking means takes, before obtaining the image data, an image of the defect repair sheet from a side on which the material layer for repair is not formed, to obtain a preliminary image data of the predetermined pattern of the material layer for repair that can be seen through the transparent sheet; the image processing means further detects a contour of the predetermined pattern based on the preliminary image data to output a result of a preliminary image processing; and the position adjusting means adjusts, before adjusting a position of the base, a position of the defect repair sheet so that a contour of the predetermined pattern matches the predetermined position, based on the result of preliminary image processing.

According to a tenth aspect, the defect repair device of the ninth aspect is characterized in that the material layer includes a layer composed of an electrode material.

According to an eleventh aspect, a method for repairing a pattern defect of a material layer that is printed on a base by using a screen plate employs a defect repair sheet in which a material layer for repair having a predetermined pattern is formed on a transparent sheet, and includes the step of pressing the material layer for repair to a defective portion of a pattern of a material layer formed on the base to transfer the material layer for repair to the defective portion; and applying an irradiating laser to the material layer for repair transferred to the defective portion to fire the material layer for repair.

According to a twelfth aspect, the method of the eleventh aspect is characterized in that the defect repair sheet further includes an adhesive layer formed on the transparent sheet so as to cover the material layer for repair, having an adhesive property to the base which makes it possible to transfer the material layer for repair to the base.

According to a thirteenth aspect, the method of the twelfth aspect is characterized in that the adhesive layer includes a layer composed of a material that evaporates in a firing processing, which is performed after transferring the material layer for repair and the adhesive layer to a defective portion of the base.

According to a fourteenth aspect, the method of the thirteenth aspect is characterized in that the material layer includes a layer composed of an electrode material.

In a first aspect according to the present invention, a defect repair sheet of a printed pattern used in repairing a pattern defect of a material layer formed by printing includes a transparent sheet, a material layer for repair formed on the transparent sheet, and an adhesive layer that is formed on the transparent sheet so as as to cover the material layer for repair and also has an adhesive property to a base. By pressing the material layer for repair of the defect repair sheet on a defective portion of a pattern, it is possible to easily and precisely transfer the material layer for repair to the defective portion by the function of the adhesive layer.

In a defect repair sheet according to a second aspect, a material layer for repair having a predetermined pattern is formed on a transparent sheet. This facilitates to determining the position of the material layer for repair that can be seen through the transparent sheet, based on image data and like, permitting the automation of defect repair.

In a defect repair sheet according to a third aspect, an adhesive layer includes a layer composed of a material whose ingredients evaporate when the adhesive layer is transferred to a base together with a material layer for repair and the material layer for repair is then fired. This prevents the unneeded adhesive layer from remaining on a base after firing.

In a defect repair device according to a fourth aspect, by using a defect repair sheet in which a material layer for repair having a predetermined pattern is formed on a transparent sheet, the material layer for repair and a pattern defective portion of a base are aligned by an alignment means, and then the material layer for repair is pressed and transferred on the defective portion by transfer means. This facilitates the automation of defect repair, improving the efficiency of defect repair.

In a method for repairing a printed pattern defect according to a fifth aspect, use of laser irradiation in firing a material layer for repair transferred to a defective portion permits making a brief firing for defect repair. In addition, the area occupied by an irradiation device for the irradiating laser is considerably smaller than that of a firing furnace, making it easy to ensure its space.

Accordingly, it is an object of the present invention to realize a simple and precise transfer of a repair material to a pattern defective portion and thus improve the working efficiency of the defect repair.

These and other objects, features, aspects and advantages of the present invention will become more apparent from the following detailed description of the present invention when taken in conjunction with the accompanying drawings.

DESCRIPTION OF THE PREFERRED EMBODIMENT

In a preferred embodiment of the present invention, a defective portion of a printed pattern that is formed on a base by screen printing is repaired by using a defect repair sheet in which a material layer for repair has previously been formed on a transparent sheet.

Figure 1:
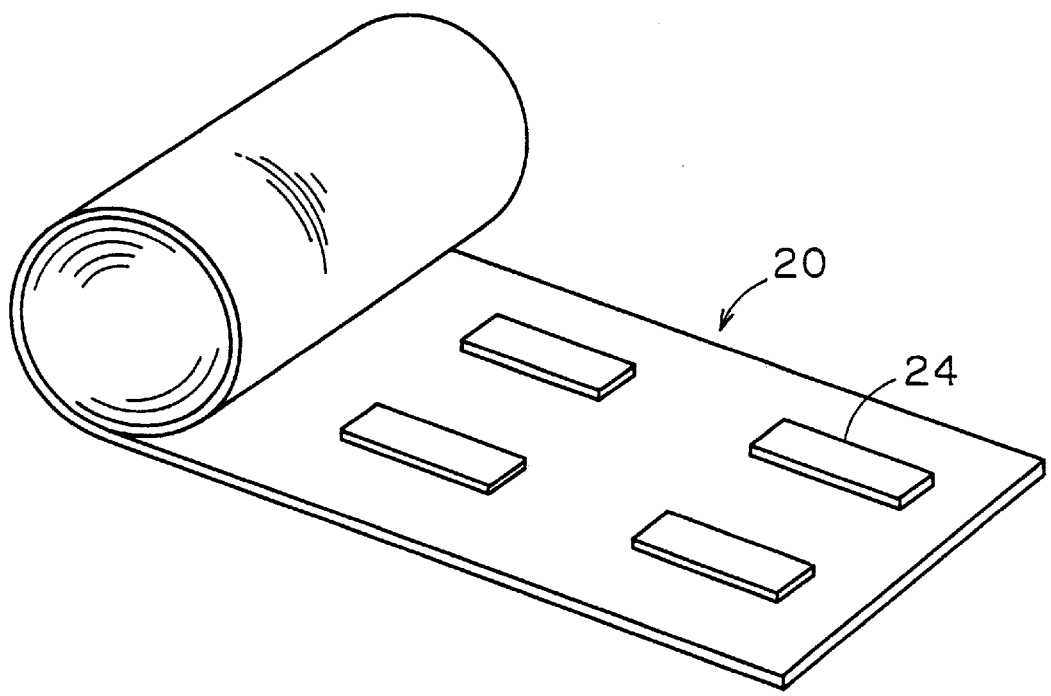
FIG. 1 is a diagram showing a defect repair sheet used in repairing a pattern defect due to printing according to the present invention.
Figure 2:
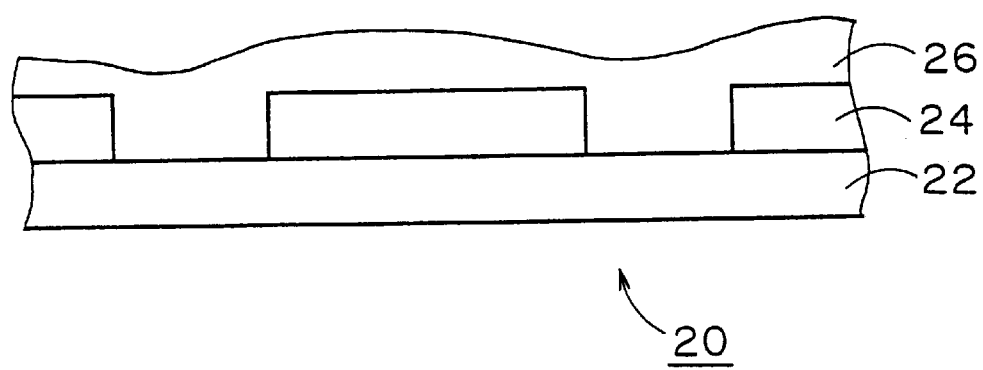
FIG. 2 is a sectional view of the defect repair sheet of FIG. 1.

FIG. 1 shows a schematic configuration of a defect repair sheet of this embodiment. FIG. 2 is a cross-sectional view of the defect repair sheet of FIG. 1 The defect repair sheet 20 includes a transparent sheet 22, a material layer for repair 24 having a predetermined pattern, and an adhesive layer 26. The material layer for repair 24 is formed on the transparent sheet 22. The adhesive layer 26 is formed on the transparent sheet 22 so as to cover the material layer for repair 24.

The transparent sheet 22 is a sheet in strip that is composed of a transparent material, such as PET (polyethylene terephthalate). The material layer for repair 24 is formed by printing a material paste, whose composition is almost the same as that of a material layer formed on a base, on the transparent sheet 22, and has a pattern corresponding to the pattern of the material layer, or a desired pattern prepared for an estimated defect shape. The material layer for repair 24 can be easily formed on the transparent sheet 22 by printing using a conventional repair screen used in defect repair.

The adhesive layer 26 is provided for peeling the material layer for repair 24 from the transparent sheet 22 and transferring it to a pattern defective portion of a base, when the side on which the material layer for repair 24 of the defect repair sheet 20 is formed (i.e., the upper side in FIG. 2) is pressed on the pattern defective portion of the base. The adhesive layer 26 also has an adhesive property to the base. The adhesive layer 26 should be made of a material which has no effect on the characteristics of the material layer for repair 24 and should disappear by vaporization in firing the material layer for repair 24 as the final step of defect repair.

Since the defect repair sheet 20 in which a plurality of patterns for defect repair have previously been formed on a transparent sheet 22 is preserved until it is used in a defect repair, the defect repair sheet 20 preferably functions to prevent the material layer for repair 24 from drying and deteriorating during preservation. As a material of the adhesive layer 26, there are for example employed acrylic resins. If no adhesive agent is used, a material layer for repair 24 having a certain degree of viscosity can be used.

Next, a method for repairing a printed pattern defect by utilizing the above defect repair sheet 20 is described hereafter by taking a plasma display panel (PDP) as example.

Figure 3:
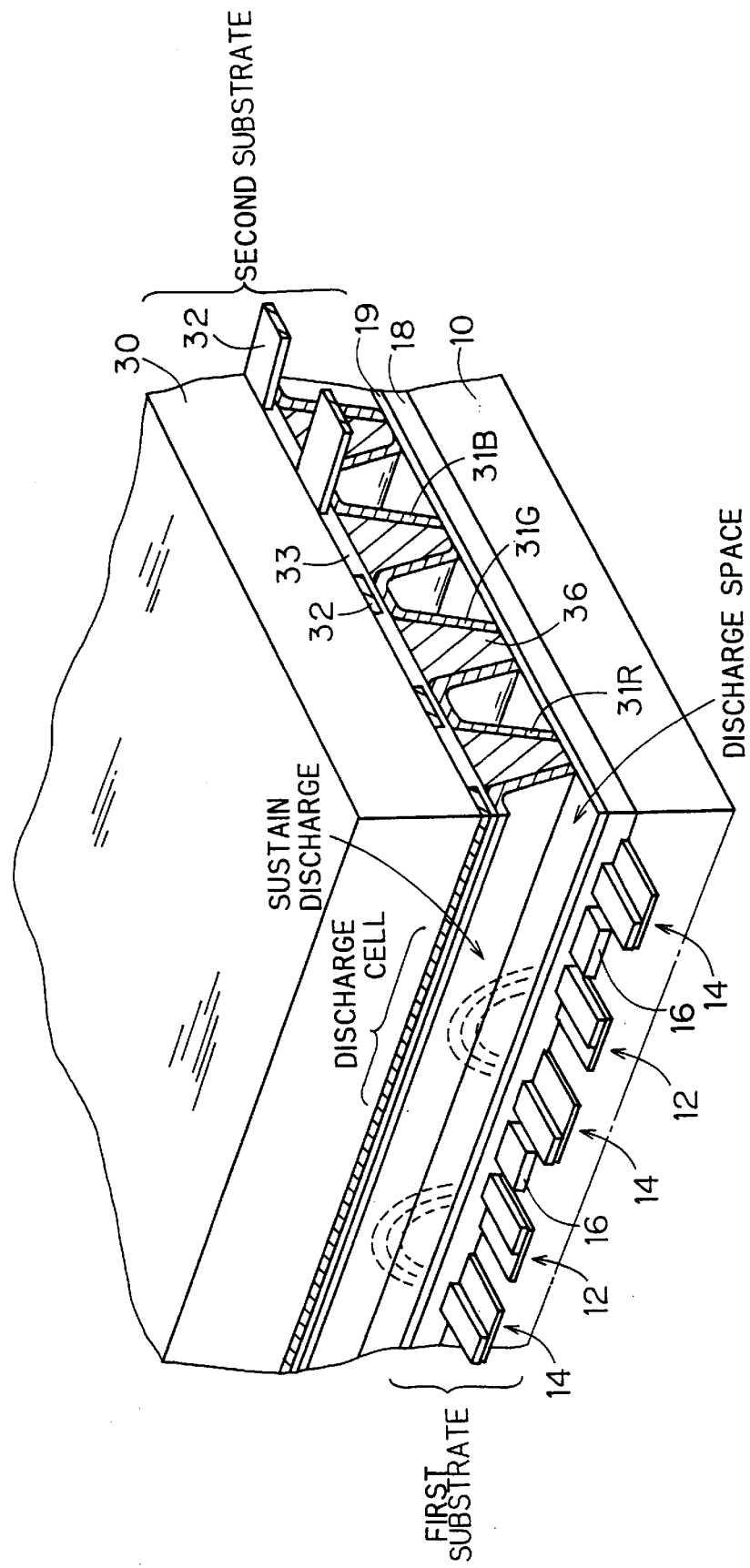
FIG. 3 is a diagram showing a schematic configuration of a plasma display according to a preferred embodiment of the present invention.

FIG. 3 shows a schematic configuration of a plane discharge AC type PDP. In this PDP, a discharge space is formed by sealing a discharge gas between a first substrate and a second substrate. By controlling the respective discharges of a plurality of discharge cells which are configured in the form of a matrix within the discharge space, phosphorous layers 31R, 31G, 31B emit light to display a desired image.

The first substrate has an FP (front panel) substrate 10 composed of glass. A sustain electrode wire (an X electrode wire) 12 and a scanning/sustain electrode wire (a Y electrode wire) 14, which constitute a pair of display electrode wires, are formed on the FP substrate 10 by screen printing. A black stripe (BS) 16, which includes a black dielectric in order to improve the display contrast, is formed by screen printing between the pair of X and Y electrode wires 12, 14 and between adjacent another pair of X and Y electrode wires 12, 14, respectively. A dielectric layer 18 is formed by screen printing over the almost entire surface of the FP substrate 10 so as to cover the two pairs of X and Y electrode wires 12, 14 and the BS 16. An MgO layer 19 composed of MgO, which becomes a cathode at the time of discharge and also functions as the protective film of the dielectric layer 18, is formed on the dielectric layer 18 by sputtering, evaporation or the like.

The second substrate has a BP (back panel) substrate 30 that is comprised of a glass substrate. Address electrode wires 32 are formed on the BP substrate 30 by screen printing in the direction in which the X and Y electrode wires 12, 14 cross at a right angle. A white glaze layer 33 for improving the luminance of a panel is formed on the almost entire surface of the BP substrate 30 by screen printing so as to cover the address electrode wires 32. A rib (hereinafter referred to as a barrier rib portion) 36 is formed in the position of a spacing between the respective address electrode wires 32 on the white glaze layer 33, in order to prevent a cross talk of light from crossing between two adjacent address electrode wires 32, 32, i.e., between discharge cells. To form a barrier rib portion 36, a glass material paste is stacked high by repeating a screen printing from a few to about 10 times and is finally fired. The phosphorous layers 31R, 31G, 31B are formed by screen printing on the walls of the address electrode wires 32 and the corresponding barrier rib portions 36, respectively.

The ends of the first and second substrates are sealed by a seal member (not shown), respectively, so that a discharge space is formed between the substrates. A discharge cell is formed in each portion defined by the X electrode wire 12 and the Y electrode wire 14, and the address electrode wire 32 crossing the wires 12, 14 at right angle.

In a PDP, a plurality of layers, such as electrode wires and dielectric layers, are formed by screen printing. A printing material paste printed on a substrate is fired to form electrode wires and the like. Thereafter, a defect of a printed pattern is detected and then repaired.

Figure 4:
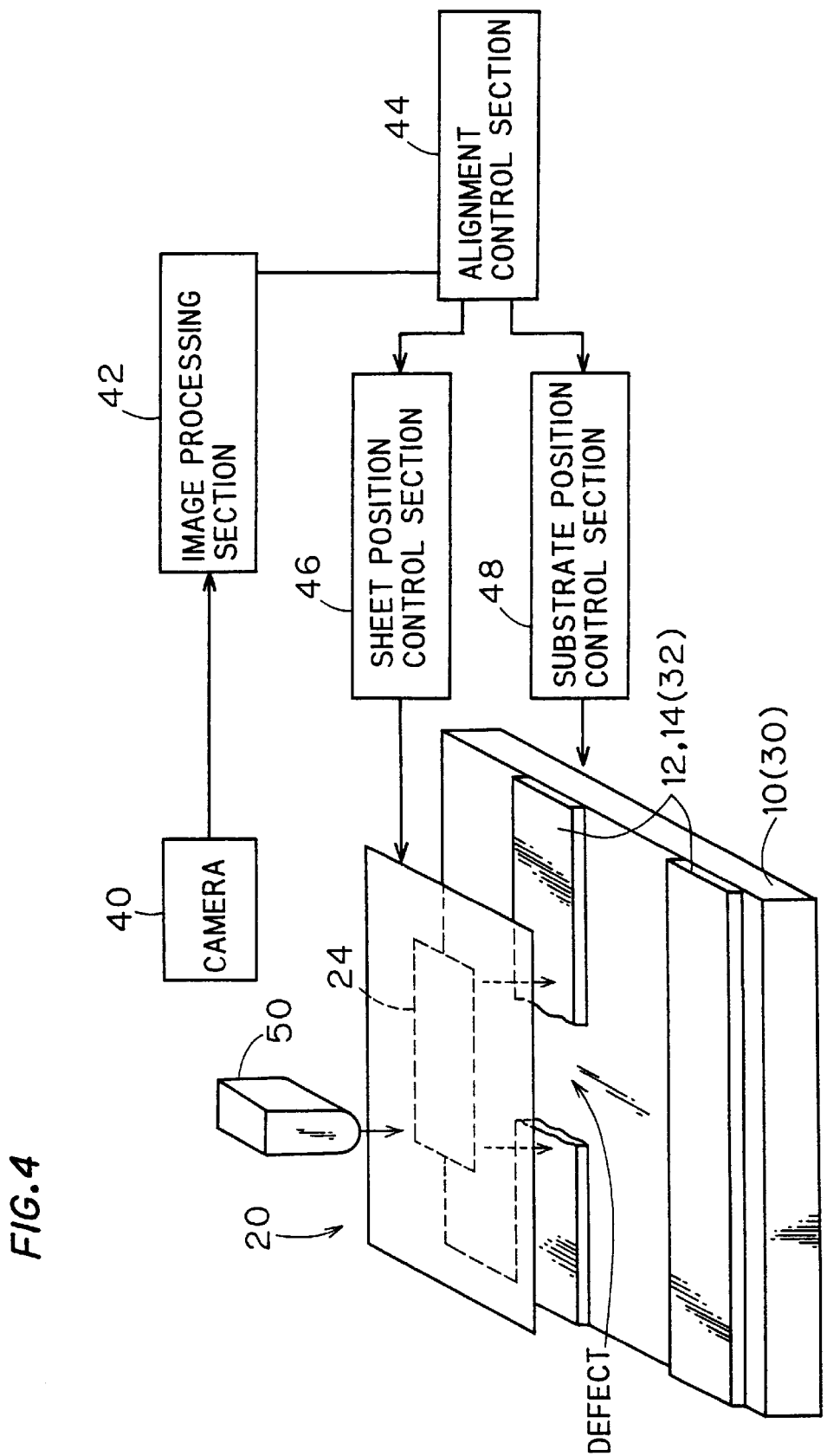
FIG. 4 is a diagram showing a schematic configuration of a defect repair device according to the preferred embodiment.

FIG. 4 shows an example of a defect repair device used in transferring a material layer for repair 24 to a pattern defective portion by using a defect repair sheet 20. A defect repair device has a camera 40 and an image processing section 42 that detects a defect and determines the positioning by processing image data. In addition, the defect repair device has an alignment control section 44, a sheet position control section 46 and a substrate position control section 48, used as alignment means for ensuring an alignment between a detected defective portion of a base and a material layer for repair 24. It also has a transfer head 50 as a transfer means for transferring a material layer for repair 24 of a defect repair sheet 20 to a defective portion of a base.

The operation of a defect repair device is described herebelow by taking the case of repairing a defect of an electrode wire as example. When repairing an electrode wire, a defect repair device shown in FIG. 4 employs a defect repair sheet 20 for repairing electrode wires. The defect repair sheet 20 is placed in front of a camera 40 so that the side on which a material layer for repair 24 is formed is directed downward. The camera 40 takes an image of the material layer for repair 24 that can be seen through a transparent sheet. An image processing section 42 detects the contour of the pattern of the material layer for repair 24 based on image data (preliminary image data) from the camera 40. An alignment control section 44 feeds a control signal to a sheet position control section 46 based on the result of the image processing obtained by the image processing section 42 (the result of a preliminary image processing), so that the pattern contour of the material layer for repair 24 matches a predetermined position. In response to the control signal, the sheet position control section 46 adjusts the position of the defect repair sheet 20.

A substrate 10 (or 30) subjected to the step of forming electrode wires (which comprises a printing and a firing)is put into a defect repair device and then placed under the camera 40, as shown in FIG. 4. The camera 40 takes an image of electrode wires 12 and 14 (or 32) on the substrate 10 (or 30). The image processing section 42 detects the pattern contours of the electrode wires 12 and 14 (or 32) based on the iamge data fed from the camera 40. The image processing section 42 detects whether a wire pattern has a defect, based on the obtained contour data. If a pattern defect is detected, the image processing section 42 detects the size of the defect and then decides whether the defect can be repaired by a single pattern formed on a material layer for repair 24 that has been positioned. If decided it is impossible to repair, the image processing section 42 determines the number of patterns (two or more patterns) on the material layer for repair 24 used in repairing the defect. In cases where plural patterns of different size (particularly, patterns of different wire length for electrode wires) as a material layer for repair 24, have previously been formed on a defect repair sheet 20, a material layer for repair 24 having a proper size may be designated and then positioned by the technique as stated above.

Next, the alignment control section 44 feeds a control signal to a substrate position control section 48 based on the aforesaid result of image processing obtained by the image processing section 42. The substrate position control section 48 adjusts a substrate position in response to the control signal. As a result, the pattern defective portions of the electrode wires 12 and 14 (or 32) are positioned so as to have a certain positional relationship with the material layer for repair 24 of the defect repair sheet 20 (e.g., the end of a defect is partly overlapped with the material layer for repair 24).

After the positioning is completed, the transfer head 50 that has been lifted upward is brought down so that the material layer for repair 24 is pressed on the pattern defective portion of the electrode wires 12 and 14 (or 32). Further, the transfer head 50 is moved along the formed pattern of the material layer for repair 24 (in the right direction in FIG. 4) in order to press the defect repair sheet 20 to the substrate 10 (or 30), thereby transferring the material layer for repair 24 to the defective portion.

After transferring the above material layer for repair 24, if it is necessary to transfer a second material layer for repair 24 to the same defective portion, the defect repair sheet 20 is taken up until the second material layer 24 is placed under the camera 40, i.e., until it reaches a predetermined transfer position. Then, the positioning between the second material layer 24 and the substrate 10 (or 30) is performed, followed by the transfer of the second material layer 24.

When the transfer of the material layer for repair 24 to a single defective portion is completed, based on the control of the alignment control section 44, the substrate 10 (or 30) is moved to perform a detection of pattern defect for other portions of the electrode wires 12 and 14 (or 32). The defect repair sheet 20 is taken up until the next material layer for repair 24 reaches a predetermined transfer position. Then, based on the control of the alignment control section 44, the alignment between a detected defective portion of the electrode wires 12, 14 (or 32) and the material layer for repair 24 is performed and the layer 24 is then transferred to the defective portion.

A preliminary pattern defect detection may be made for the entire surface of a single substrate put into a defect repair device. In this case, the coordinate of a detected pattern defect is stored, and the position of the substrate is controlled so that the stored coordinate of the defect is placed under the defect repair sheet 20. Then, a material layer for repair 24 is transferred in sequence to the stored coordinate of the defect.

Figure 10:
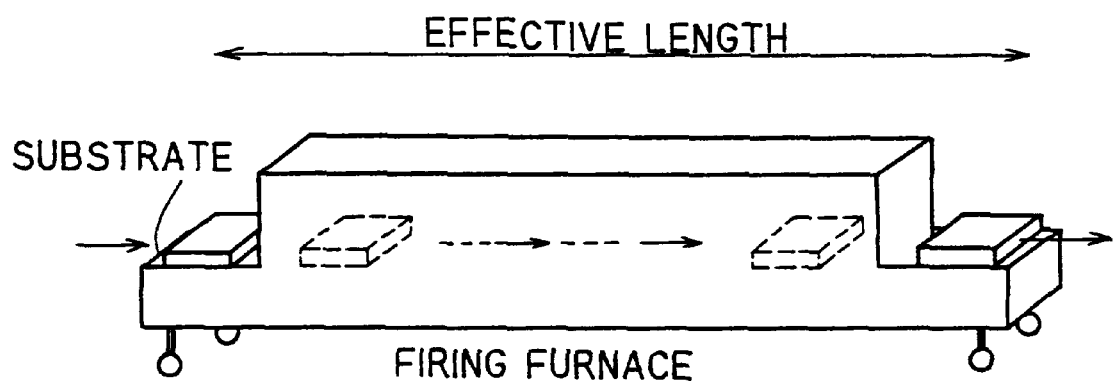
FIG. 10 is a diagram showing a schematic configuration of a conventional firing furnace.

After the material layer for repair 24 of the defect repair sheet 20 is transferred to all the defective portions of an electrode wire pattern on a single substrate, the substrate 10 (or 30) is put into a firing furnace as shown in FIG. 10. In the firing furnace the material layer for repair 24 and an adhesive layer 26 transferred to the defective portion are heated so that the adhesive layer 26 is vaporized and the pasty material layer for repair 24 is fired, thus completing the repair of the defective portion.

Meanwhile, the overall length of a firing or heating furnace is several tens of meters, and the area occupied by a single firing furnace is large, i.e., 50–100 m$^2$. Therefore, it is often difficult to conserve a firing furnace for defect repair within a factory where an effective space for providing such a furnace is limited. In a firing furnace, the time required from the input of a substrate into the furnace to its withdrawal i.e., the tact time, is about several hours, resulting in a long term firing. From the viewpoint that the firing for defect repair is executed efficiently with a simple construction, it is preferable to perform a partial firing or heating, as shown in FIG. 5B, by laser irradiation from a laser device, such as a carbon dioxide gas laser.

Figure 5A:
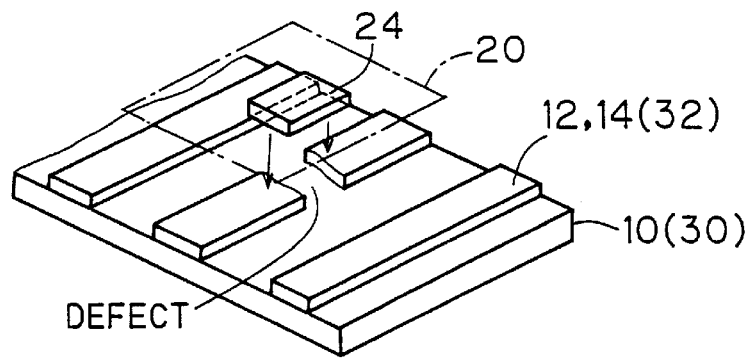
FIGS. 5A to 5C are a diagram for explaining a method for repairing a defect of electrode wire pattern according to the preferred embodiment.
Figure 5B:
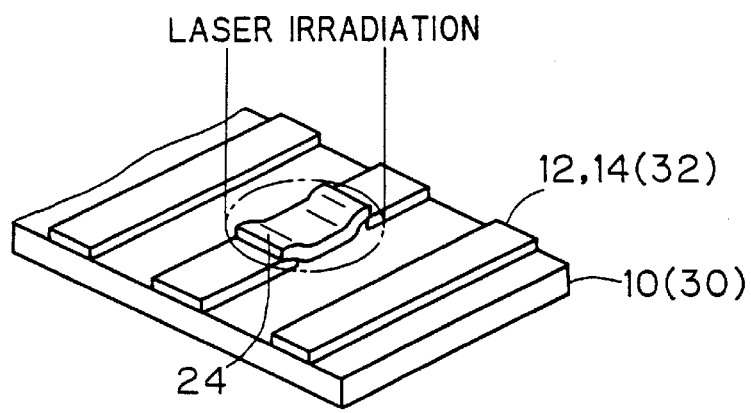
Figure 5C:
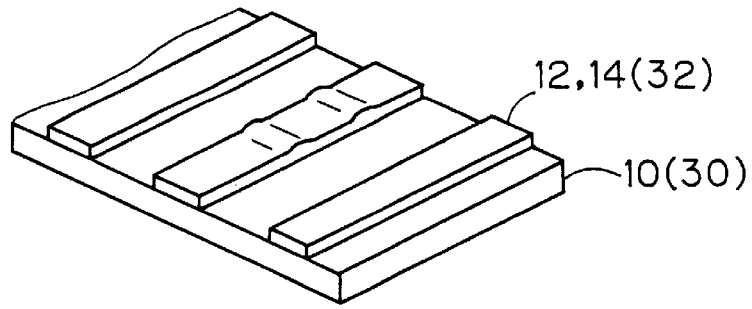

Specifically, after a material layer for repair 24 is transferred to a pattern defective portion by using a defect repair sheet 20, as shown in FIGS. 4 and 5A, laser is irradiated to a repaired portion, as shown in FIG. 5B. As a result, an adhesion layer 26 transferred to the defective portion evaporates and the material layer for repair 24 is selectively fired to repair the pattern defect as shown in FIG. 5C. The area occupied by a laser irradiation device is smaller than that of a firing furnace. That is, about 10 m$^2$ is enough and even about 5 m$^2$ is enough if a PDP can be housed. In addition, the laser irradiation time required per defective portion is extremely short, i.e., from about a few seconds to about a few minutes. Therefore, firing a defective portion of a material layer for repair 24 by using laser provides a further improvement of defect repair efficiency, i.e., manufacturing efficiency. Since the laser output and laser irradiation time can be easily adjusted depending on a material fired, the firing of a defective portion occurred in the printing step of each layer can be conducted in a short time by employing a general laser irradiation device.

Thus, applications of a defect repair sheet 20 including a material layer for repair 24 of a certain shape in defect repairs of patterns having a certain wire width, such as electrode wire patterns, makes it possible to perform a pattern defect repair with ease and high accuracy. Therefore, it is free from the problem that paste drips on a substrate, unlike the cases where a material paste for repair is placed on a defective portion by printing.

Since a material layer for repair 24 that has previously been printed is transferred, the transfer quantity of the material layer 24 does not change greatly even when the control at the time of transfer varies somewhat, leading to an easy control. This permits an easier and automated defect repair. In addition, after transfer, the above material layers for repair 24 are fired by laser irradiation. This enables to efficiently fire or heat pattern defective portion, facilitating the improvement of the overall working efficiency.

Figure 6:
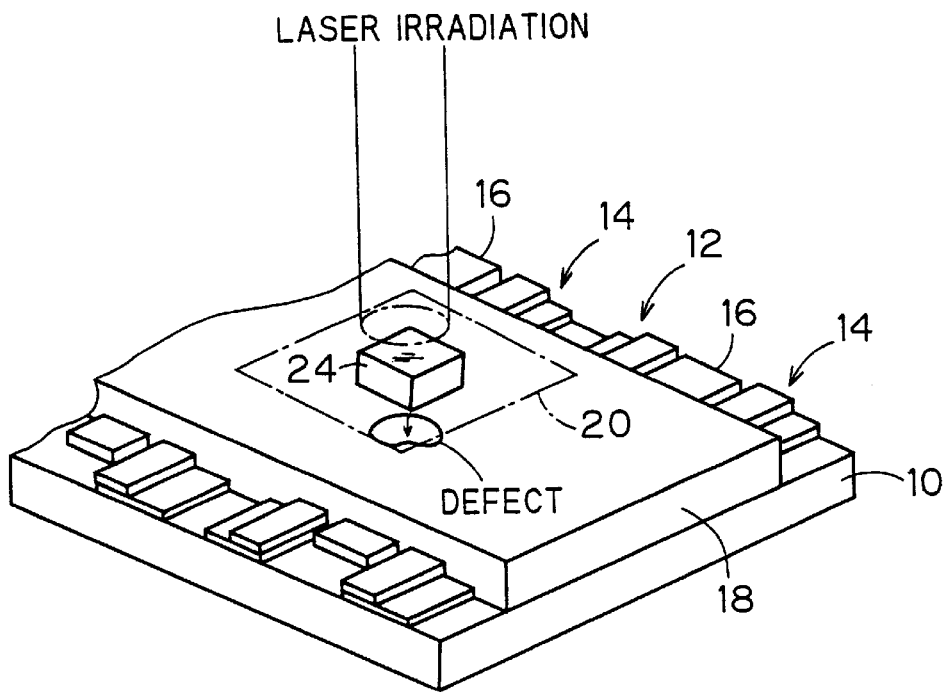
FIG. 6 is a diagram for explaining a method for repairing a defect of a dielectric layer according to the preferred embodiment.
Figure 7:
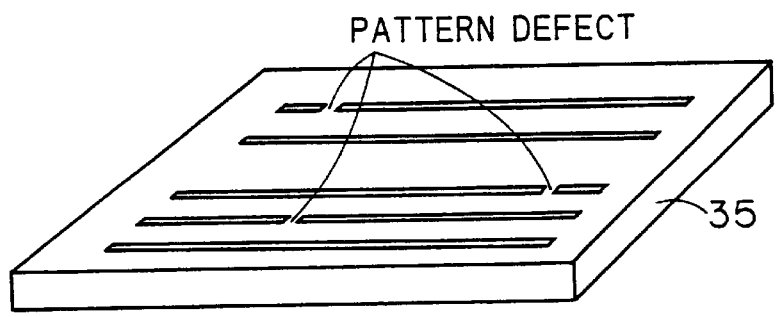
FIG. 7 is a diagram showing a defect of a printed pattern formed by a conventional screen printing.
Figure 8:
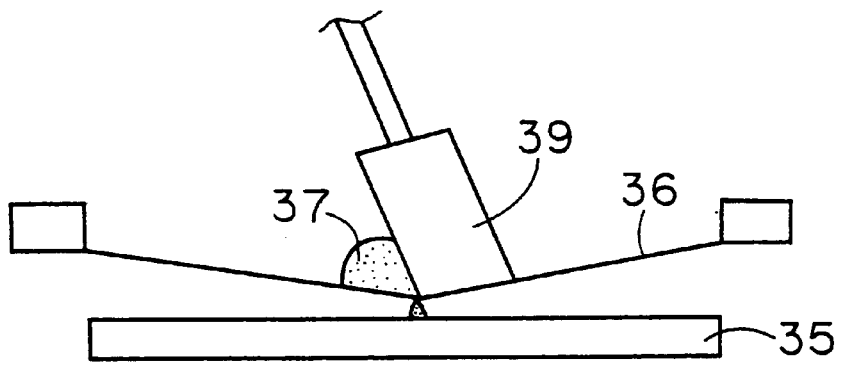
FIG. 8 is a diagram showing a conventional method for repairing a defect of a printed pattern.
Figure 9:
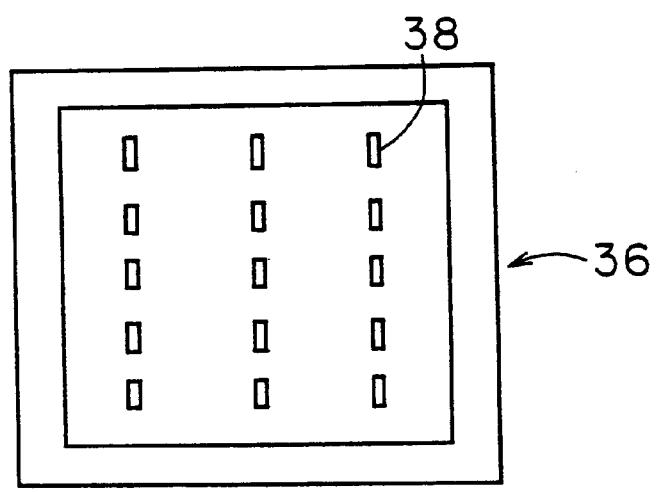
FIG. 9 is a diagram showing a conventional repair screen.

Besides the defect repair of electrode wires, pattern defects of other layers formed by screen printing can be easily repaired with high accuracy in the same manner as described. FIG. 6 shows a method for repairing a defect of a dielectric layer 18 that is formed on a first substrate of a PDP by screen printing. Layers printed on the entire surface of a substrate often cause hole-shaped defeats as shown in FIG. 6. In order to repair such defects a defect repair sheet 20 is used having a material layer for repair 24 whose composition is approximately the same as that of the printing material paste of the dielectric layer 18, and the material layer 24 is transferred to a defective portion and then fired.

When repairing a defect of an electrode wire pattern having a certain wire width as shown in FIGS. 5A to 5C, it is preferable to use a material layer for repair 24 having a width identical with the wire width, from the standpoint of improving working efficiency. When a material layer for repair 24 is used in repairing hole-shaped defects occuring in dielectric layers and the like, its width and shape are not limited, and a pattern may have a size suitable for an estimated defect size (e.g., it may be square as shown in FIG. 6, alternatively, rectangular or round).

While the invention has been shown and described in detail above, the foregoing description is in all aspects illustrative and not restrictive. It is therefore understood that numerous modifications and variations can be devised without departing from the spirit and scope of the invention.

I claim:

1. A printed pattern defect repair sheet, for use in repairing pattern defects on a material layer that is printed on a base by employing a screen plate, said printed pattern defect repair sheet comprising:

a transparent sheet;

a material layer for repair formed on said transparent sheet; and an adhesive layer formed on said transparent sheet for covering said material layer for repair, wherein said adhesive layer has an adhesive property thereby making it possible to transfer said material layer for repair to the base.

2. The printed pattern defect repair sheet of claim 1, wherein said material layer for repair formed on said transparent sheet is arranged in at least one pattern.

3. The printed pattern defect repair sheet of claim 1, wherein said adhesive layer includes a layer composed of a material that evaporates in a heating process performed subsequent to transferring said material layer for repair and said adhesive layer to a defective portion of the base.

4. The printed pattern defect repair sheet of claim 3, wherein said material layer for repair includes a layer composed of an electrode material.

5. The defect repair sheet of claim 1, wherein said adhesive layer includes a layer composed of a material that evaporates or vaporizes during a heating process.

6. The defect repair sheet of claim 1, wherein transparent sheet is composed of polyethylene terephthalate.

7. The defect repair sheet of claim 2, wherein said at least one pattern corresponds to at least one pattern of said material layer.

8. The defect repair sheet of claim 1, wherein said adhesive layer is composed of a material which minimally affects characteristics of said material layer for repair.

9. The defect repair sheet of claim 1, wherein said adhesive layer is composed of an acrylic resin material.

10. A defect repair sheet having a printed pattern arranged thereon for use in repairing at least one pattern defect on a material layer which is printed on a base using a screen plate, comprising:

a transparent sheet; and a material layer for repair formed on said transparent sheet, wherein said material layer for repair has a sufficient viscosity such that said material layer for repair is able to adhere to the base.

11. The defect repair sheet of claim 10, wherein transparent sheet is composed of polyethylene terephthalate.

12. The defect repair sheet of claim 10, wherein said material layer for repair formed on said transparent sheet is arranged in at least one pattern.

13. The defect repair sheet of claim 12, wherein said at least one pattern corresponds to at least one pattern of said material layer.

* * * * *